United States Patent [19]

Moslehi

[11] Patent Number: 5,252,501
[45] Date of Patent: Oct. 12, 1993

[54] SELF-ALIGNED SINGLE-MASK CMOS/BICMOS TWIN-WELL FORMATION WITH FLAT SURFACE TOPOGRAPHY

[75] Inventor: Mehrdad M. Moslehi, Dallas, Tex.

[73] Assignee: Texas Instruments Incorporated, Dallas, Tex.

[21] Appl. No.: 814,547

[22] Filed: Dec. 30, 1991

[51] Int. Cl.$^5$ ............................................. H01L 21/265
[52] U.S. Cl. ........................................ 437/34; 437/56; 437/57; 437/89; 257/371
[58] Field of Search .................... 437/34, 56, 57, 89, 437/90; 257/274, 351, 371

[56] References Cited

U.S. PATENT DOCUMENTS

| | | | |
|---|---|---|---|
| 4,050,965 | 9/1977 | Ipri et al. | 437/59 |
| 4,424,621 | 1/1984 | Abbas et al. | 437/59 |
| 4,527,325 | 9/1985 | Geipel, Jr. et al. | 437/34 |
| 4,558,508 | 12/1985 | Kinney et al. | 437/34 |
| 5,132,241 | 7/1992 | Su | 437/34 |

Primary Examiner—Olik Chaudhuri
Assistant Examiner—Long Pham
Attorney, Agent, or Firm—Jacqueline J. Garner; Richard Donaldson; William E. Hiller

[57] ABSTRACT

A single-mask self-aligned process is disclosed for formation of n and p wells for advanced CMOS and BiCMOS technologies. The proposed process forms n-well and p-well regions using a single microlithography masking step along with a selective semiconductor (Si or GeSi) growth SSG process without producing surface topography or degrading device surface planarity. This simple process ensures uniform and repeatable NMOS and PMOS gate patterning due to flat surface topography. The n-to-p well placement and spacing is self-aligned due to the use of a disposable SSG hard mask.

20 Claims, 1 Drawing Sheet

SELF-ALIGNED SINGLE-MASK CMOS/BICMOS TWIN-WELL FORMATION WITH FLAT SURFACE TOPOGRAPHY

BACKGROUND OF THE INVENTION

Advanced CMOS and BiCMOS technologies employ twin (n and p) wells in order to allow simultaneous optimization of the NMOS and PMOS transistors. The conventional twin well formation processes employ one or two microlithography masking steps. The two-mask fabrication process has the advantage that it does not degrade the silicon surface planarity or topography. This is an important requirement in advanced sub-0.5 $\mu$m CMOS and BiCMOS technologies where even a small (e.g. a few thousand Å) step between the n-well and p-well regions can result in gate length variations between the NMOS and PMOS transistors (due to the limited depth-of-focus orDOF budget in advanced photo-lithography tools). The CMOS transistor gate length variations (after patterning and etch) can degrade manufacturability and yield. As a result, the process simplicity of the conventional one-mask fabrication process is not a strong and sufficient advantage/improvement to justify its use in sub-0.5 $\mu$m semiconductor technologies since the one-mask process consumes silicon when masking a particular area to provide a well region. Such oxidation-induced silicon consumption results in uneven planarity of the PMOS and NMOS gates as shall be explained below. The smaller the device gate-lengths the more critical uneven planarity becomes. As discussed, the potential gate length variability caused by the nonplanar n and p well surfaces and DOF limitation imposes the above-mentioned obstacle. The surface topography problem in the conventional one-mask fabrication process is generated by a selective thermal oxidation process. An oxide/nitride stack is patterned and is used (usually along with the photoresist mask) as an ion implantation mask to define one of the wells. After removal of the photoresist, an oxidation step is performed which selectively defines an oxide hard mask over the implanted region. A second ion implantation step is used to define the second (opposite) well regions. As this process flow indicates, a surface topography or step is produced between the n and p well regions due to the silicon consumption by the selective thermal oxidation step.

Thus, advanced sub-0.5 $\mu$m CMOS and BiCMOS technologies usually rely on a two-mask (non-self aligned) process to define the n-well and p-well regions. In the two-mask process, patterned photoresist (or hard mask) layers are used as ion implantation masks. No surface step or topography is produced, therefore allowing uniform PMOS and NMOS gate patterning. However, the use of one additional masking process adds to the overall process cost and complexity.

Therefore, there is a need for a simple self-aligned manufacturable single-mask process for formation of n-well and p-well regions without the surface topography and gate patterning DOF problems of the conventional one-mask methods.

Figure 1:
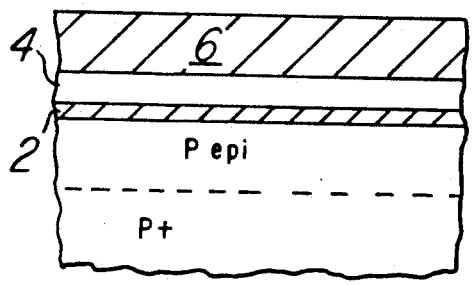
FIGS. 1 through 5 illustrate cross-sectional drawings of the resulting structure from the following processing steps.

Applicable reference numerals have been carried forward.

SUMMARY OF THE INVENTION

A single-mask self-aligned process is disclosed for formation of n and p wells for advanced CMOS and BiCMOS technologies. The proposed process forms n-well and p-well regions using a single microlithography masking step along with a selective semiconductor (Si or GeSi) growth (SSG) process without producing surface topography or degrading surface planarity. This simple process ensures uniform NMOS and PMOS gate patterning due to flat surface topography. The n-to-p well placement is self-aligned due to the use of a disposable SSG hard mask.

DETAILED DESCRIPTION OF THE INVENTION

The invention provides a single-mask self-aligned twin well formation process for advanced CMOS and BiCMOS technologies. The process is based on the use of a selectively grown semiconductor (or metal) hard mask. The process flow for the preferred embodiment of the process flow is as follows:

1. With reference to FIG. 1 which illustrates a portion of the resulting structure formed from process steps of the invention, fabricate a stack of oxide 2/polysilicon 4/oxide 6 over, for instance, a p epitaxial layer lying on a p+ (highly doped p-type) substrate using thermal oxidation, low pressure chemical-vapor deposition (LPCVD) of polysilicon, and LPCVD or plasma enhanced chemical-vapor deposition (PECVD) of oxide. Note that the p-epitaxial layer and the p+ substrate may be collectively called the substrate. Lower oxide layer 2 may be 100 to 1000 Å (e.g. 200 Å). Polysilicon layer 4, which acts as a buffer layer may be 200–1000 Å (e.g. 500 Å). Top oxide layer 6 is chosen to be 5000–15000 Å (e.g. 1 $\mu$m).

Figure 2:
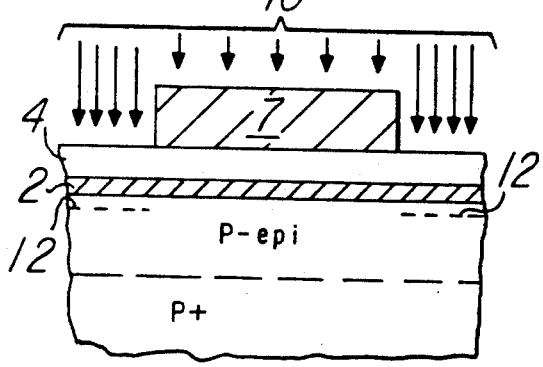

2. With reference to FIG. 2 which illustrates a cross-sectional drawing of the resulting structure from the following processing steps, use a well microlithography mask and appropriate photoresist to pattern and etch oxide 6 using an anisotropic oxide etch to form an oxide hard mask 7. Polysilicon layer 4 acts as an etch-stop layer for the oxide etch process. The exposed polysilicon regions from which oxide was removed correspond to one polarity of the well regions, for instance n-well regions, to be formed later in the p-epitaxial layer. Next perform a n-type (such as phosphorus) ion implantation, indicated by arrows 10, to incorporate the first well (e.g. n-well) dopant atoms into the substrate through the exposed thin polysilicon windows. The thick patterned oxide 7 will prevent dopant incorporation in its underlying substrate regions, thus acting as an ion implantation hard mask. Strip the photoresist. Note that the photoresist may be stripped before or after the well ion implantation. The resulting n-well implant profile is labeled 12 in FIG. 2.

Figure 3:
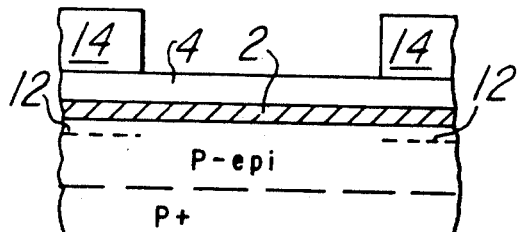

3. With reference to FIG. 3 which illustrates a cross-sectional drawing of the resulting structure from the following processing steps, perform selective semiconductor growth (SSG) to form SSG layer 14 using the exposed polysilicon regions above implant 12 as seed layers for selective silicon (or silicon germanium) deposition. The selectivity of the growth should preferably be as high as possible so as to result in a well defined hard mask to be formed by the SSG layer as shall be explained below. Facets and sidewall or bulk defects will not cause any problem. This is due to the fact that SSG layer 14 will be used as a disposable hard mask for a well region to be formed of an opposite conductivity type from that discussed in step 2 during a subsequent well ion implantation. SSG layer 14 may be grown to be as thick as the oxide hard mask (e.g. 1 μm). Next, remove the thick oxide hard mask 7 shown in FIG. 2 by using a selective oxide etch such as a wet etch or a vapor-phase etch. Alternatively, a layer formed from selective deposition processes such as chemical-vapor deposited tungsten (CVD-W) may be used in place of the SSG layer. However, the SSG layer formation is a process step for the preferred embodiment of the invention.

Figure 4:
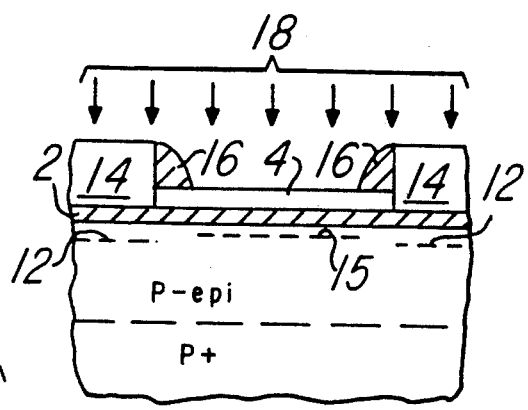

4. With reference to FIG. 4 which illustrates a cross-sectional view of the resulting structure from the following processing steps form dielectric spacers 16 such as oxide spacers using conformal oxide deposition, e.g. low-pressure chemical-vapor deposition (LPCVD) using tetraethylorthosilicate (TEOS), and an anisotropic oxide etch-back process. Formation of spacers 16 is optional. Alternatively, nitride spacers can optionally be formed instead of oxide. The thickness of spacer 16 (e.g. 5000 Å) will determine the self-aligned spacing between the n-well and p-well implants (excluding the lateral implant straggle or spread). Optional spacers 16 serve to minimize the lateral dopant compensation due to intermixing of the n-well and p-well profiles after well diffusion or drive-in. Next, form a well of the opposite conductivity from the wells to be formed in the previous steps. For instance, assuming n-wells were to be formed previously, perform a p-type ion implantation (i.e. boron ion implantation), indicated by arrows labeled 18, overall. SSG regions 14 and dielectric spacers 16 will act as self-aligned hard masks during implantation. The resultant p-well implant profile is shown as region 15.

Figure 5:
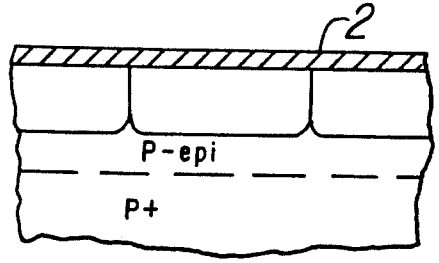

5. With reference to FIG. 5 which illustrates a cross-sectional drawing of the resulting structure from the following process steps, perform a selective etch, such as a wet etch or vapor-phase etch to remove spacers 16 (assuming oxide spacers) shown in FIG. 4. Next perform a selective polysilicon etch to clear the surface down to oxide layer 2. Diffuse the n-well and p-well regions using furnace or rapid thermal processing-based anneal in, for instance, an ammonia ambient (to take advantage of the oxynitridation-enhance diffusion or ONED effect) or in an oxidizing or inert ambient. N-wells and p-wells are thus formed.

6. The well regions now being appropriately formed, proceed with any remaining desired device fabrication steps to complete the device manufacturing process.

Although the invention has been described in detail herein with reference to its preferred embodiment and certain described alternatives, it is to be understood that this description is by way of example only, and it is not to be construed in a limiting sense. It is to be further understood that numerous changes in the details of the embodiments of the invention and additional embodiments of the invention, will be apparent to, and may be made by, persons of ordinary skill in the art having reference to this description. For instance, p-wells could have been formed in place of n-wells and vice versa. It is contemplated that all such changes and additional embodiments are within the spirit and true scope of the invention as claimed below.

I claim:

1. A single-mask self-aligned process for forming n-wells and p-wells comprising:
    forming a first dielectric/semiconductor/second dielectric stack over a substrate, said first dielectric being thicker than said second dielectric;
    etching away a portion of said first dielectric from said stack;
    implanting a dopant of a selected conductivity type into said substrate using said remaining first dielectric as an implant mask;
    selectively growing a semiconductor layer using said semiconductor layer as a seed layer;
    removing the remaining first dielectric; and
    implanting a dopant of an opposite conductivity type from said selected conductivity type using said selectively grown semiconductor layer as an implantation mask.

2. A process as recited in claim 1 wherein said first and second dielectrics comprise oxide and said semiconductor comprises polycrystalline silicon.

3. A process as recited in claim 2 wherein said first dielectric is etched using an anisotropic oxide etch.

4. A process as recited in claim 1 wherein said selectively grown layer is one micron thick.

5. A process as recited in claim 1 wherein a dielectric spacer is formed along said selectively grown layer prior to said implantation of opposite conductivity type.

6. A process as recited in claim 5 wherein said spacer is selected from the group consisting of oxide, nitride or oxynitride.

7. A process as recited in claim 1 wherein said substrate is heated after said step of implantation of said opposite conductivity type so as to diffuse said implants into said substrate.

8. A process as recited in claim 7 wherein said substrate is heated using a furnace.

9. A process as recited in claim 7 wherein said substrate is heated using rapid thermal processing-based anneal in an ammonia ambient.

10. A process as recited in claim 7 wherein said semiconductor and first dielectric layers are removed prior to said heating step.

11. A single-mask self-aligned process for forming n-wells and p-wells comprising:
    forming a first dielectric/semiconductor/second dielectric stack over a substrate, said first dielectric being thicker than said second dielectric;
    etching away a portion of said first dielectric from said stack;
    implanting a dopant of a selected conductivity type into said substrate using said remaining first dielectric as an implant mask;
    selectively depositing a layer;
    removing the remaining first dielectric; and
    implanting a dopant of an opposite conductivity type from said selected conductivity type using said selectively deposited layer as an implantation mask.

12. A process as recited in claim 11 wherein said first and second dielectrics comprise oxide and said semiconductor comprises polycrystalline silicon.

13. A process as recited in claim 12 wherein said first dielectric is etched using an anisotropic oxide etch.

14. A process as recited in claim 11 wherein a dielectric spacer is formed along said selectively deposited layer prior to said implantation of opposite conductivity type.

15. A process as recited in claim 14 wherein said spacer is selected from the group consisting of oxide, nitride or oxynitride.

16. A process as recited in claim 11 wherein said substrate is heated after said step of implantation of said opposite conductivity type so as to diffuse said implants into said substrate.

17. A process as recited in claim 16 wherein said substrate is heated using a furnace.

18. A process as recited in claim 16 wherein said substrate is heated using rapid thermal processing-based anneal in an ammonia ambient.

19. A process as recited in claim 16 wherein said polycrystalline and first dielectric are removed prior to said heating step.

20. A single-mask self-aligned process for forming n-wells and p-wells comprising:

forming a first dielectric/semiconductor/second dielectric stack over a substrate, said first dielectric being thicker than said second dielectric;

etching away a portion of said first dielectric from said stack so as to expose a portion of said semiconductor;

implanting a dopant of a selected conductivity type into said substrate using said remaining first dielectric as an implant mask;

selectively depositing chemical-vapor deposited tungsten over said exposed semiconductor;

removing the remaining first dielectric; and implanting a dopant of an opposite conductivity type from said selected conductivity type using said chemical-vapor deposited tungsten as an implantation mask.

* * * * *